(12) United States Patent
Okumura

(10) Patent No.: US 9,905,811 B2
(45) Date of Patent: Feb. 27, 2018

(54) PRODUCTION METHOD FOR JOINED BODY

(71) Applicant: JOLED INC., Tokyo (JP)

(72) Inventor: Hiroko Okumura, Osaka (JP)

(73) Assignee: JOLED INC., Tokyo (JP)

( * ) Notice: Subject to any disclaimer, the term of this patent is extended or adjusted under 35 U.S.C. 154(b) by 7 days.

(21) Appl. No.: 14/411,686

(22) PCT Filed: Aug. 6, 2013

(86) PCT No.: PCT/JP2013/004754
§ 371 (c)(1),
(2) Date: Dec. 29, 2014

(87) PCT Pub. No.: WO2014/024479
PCT Pub. Date: Feb. 13, 2014

(65) Prior Publication Data
US 2015/0194636 A1   Jul. 9, 2015

(30) Foreign Application Priority Data
Aug. 7, 2012 (JP) ................................ 2012-174702

(51) Int. Cl.
*H01L 51/56* (2006.01)
*H01L 51/00* (2006.01)
(Continued)

(52) U.S. Cl.
CPC ............... *H01L 51/56* (2013.01); *C09J 5/00* (2013.01); *H01L 51/0024* (2013.01);
(Continued)

(58) Field of Classification Search
CPC ................... H01L 51/56; H01L 27/322; H01L 2221/68386; H01L 2221/6839;
(Continued)

(56) References Cited

U.S. PATENT DOCUMENTS

| 5,318,651 A * | 6/1994 | Matsui | H01L 24/81 |
|---|---|---|---|
| | | | 156/273.3 |
| 2008/0042552 A1* | 2/2008 | Cok | B82Y 20/00 |
| | | | 313/501 |

(Continued)

FOREIGN PATENT DOCUMENTS

| JP | 02-142156 | 5/1990 |
| JP | 2007-200591 | 8/2007 |

(Continued)

OTHER PUBLICATIONS

Copending U.S. Appl. No. 14/388,874, filed Sep. 29, 2014.*
(Continued)

*Primary Examiner* — Lauren R Bell
(74) *Attorney, Agent, or Firm* — Greenblum & Berstein, P.L.C.

(57) ABSTRACT

A method of manufacturing a joined body, including: covering a first area and a second area of a first substrate with a sheet of resin in uncured state; separating a part of the sheet covering the second area from the first substrate, the separating performed after the covering; and joining the first substrate with a second substrate by arranging the second substrate to face the first substrate with a part of the sheet covering the first area between the first substrate and the second substrate, and curing the resin in the part of the sheet covering the first area, the joining performed after the separating. In the method, during the separating, a phase difference δ between stress and strain in the part of the sheet covering the second area is no greater than 48 degrees.

9 Claims, 14 Drawing Sheets

(51) Int. Cl.
  *C09J 5/00* (2006.01)
  *H01L 51/52* (2006.01)
  *H01L 27/32* (2006.01)

(52) U.S. Cl.
  CPC ..... *H01L 51/5253* (2013.01); *C09J 2203/318* (2013.01); *H01L 27/322* (2013.01); *H01L 2251/556* (2013.01)

(58) Field of Classification Search
  CPC ...... H01L 2221/68395; H01L 23/293–23/296; H01L 2933/005; H01L 2933/0025; H01L 51/5253–51/5256; H01L 2251/56; H01L 2251/566; H01L 51/0024; C09J 2203/318; C09J 5/00–5/10
  See application file for complete search history.

(56) References Cited

U.S. PATENT DOCUMENTS

2010/0279578 A1* 11/2010 Matsuzaki ............ H01L 51/524
          445/25
2013/0056686 A1* 3/2013 Namiki .................. C08G 59/42
          252/500
2013/0092974 A1* 4/2013 Kimura .................. H01L 33/56
          257/100
2015/0054006 A1* 2/2015 Okumura ............... H01L 51/56
          257/89

FOREIGN PATENT DOCUMENTS

| JP | 2010-182530 | 8/2010 | |
|---|---|---|---|
| JP | 2011-201978 | 10/2011 | |
| WO | 2011/129372 | 10/2011 | |
| WO | 2012/164612 | 12/2012 | |
| WO | WO 2012164612 A1 * | 12/2012 | ............. G02B 5/201 |

OTHER PUBLICATIONS

Machine translation of WO2012164612, translated Aug. 2, 2016.*
U.S. Appl. No. 14/388,876 to Okumura et al., filed Sep. 29, 2014.
Search report from PCT/JP2013/004754, dated Oct. 29, 2013.

* cited by examiner

FIG. 1
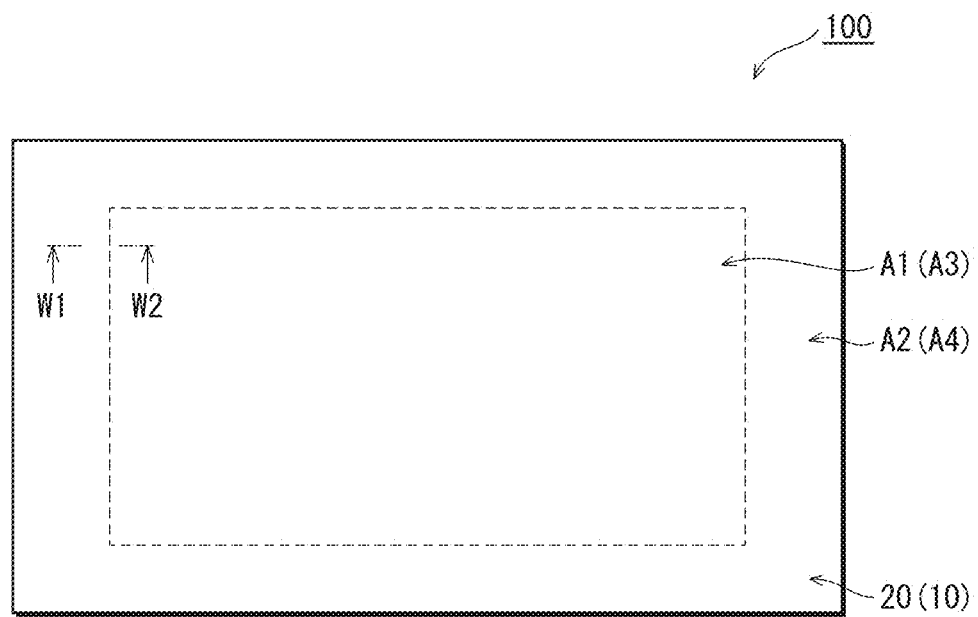
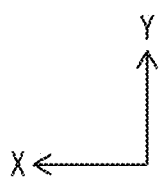

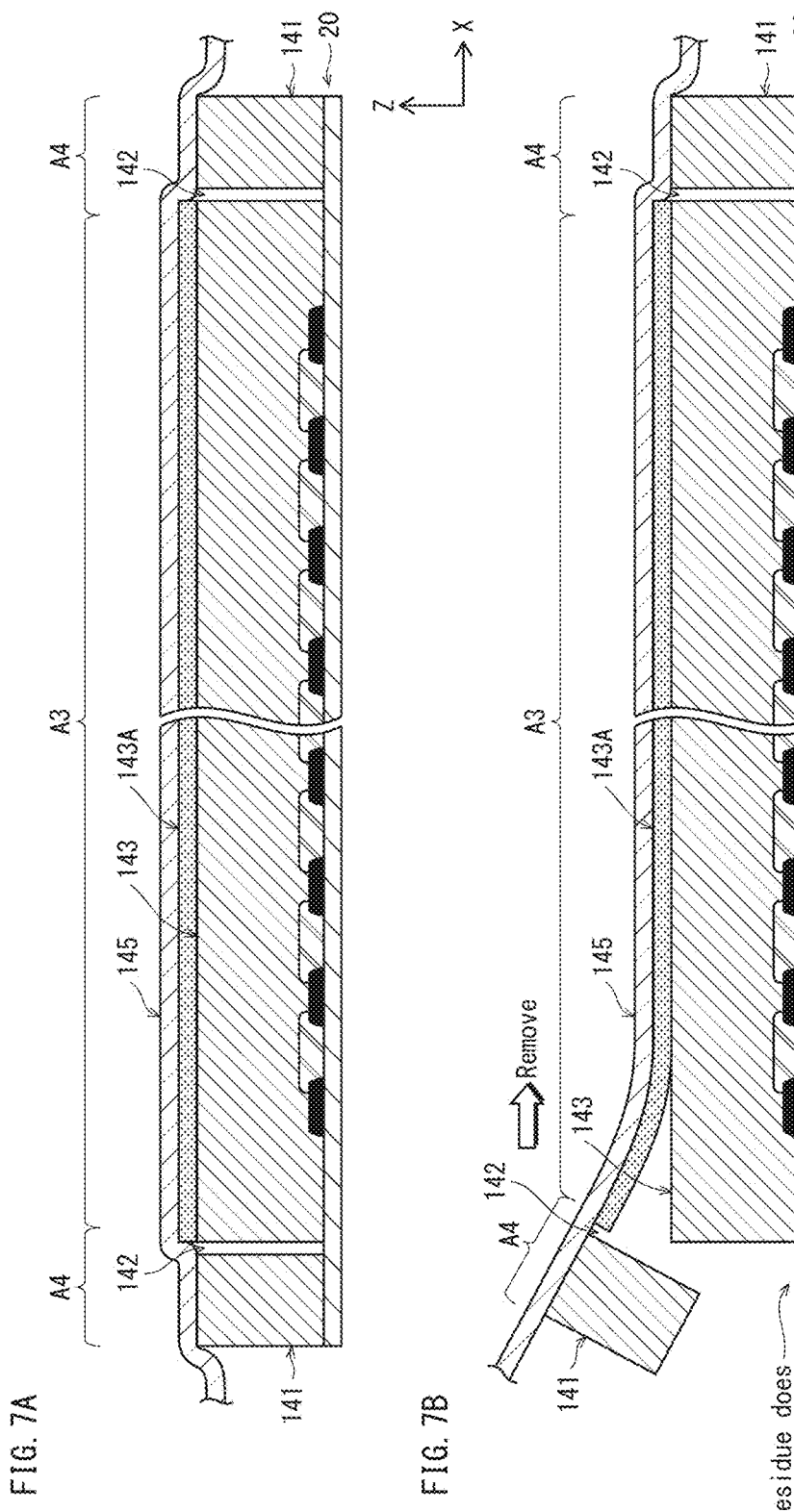

PRODUCTION METHOD FOR JOINED BODY

TECHNICAL FIELD

The present disclosure relates to a method of manufacturing a joined body. In particular, the present disclosure relates to a method of manufacturing a joined body by using a sheet material.

BACKGROUND ART

Conventional technology provides a joined body that includes two substrates joined together via sealing resin in the form of a sheet. The two substrates, for example, may be an EL substrate including a plurality of organic EL elements and a CF substrate including a plurality of color filter layers. Joining an EL substrate and a CF substrate together via sheet-form sealing resin provides an organic EL display panel (refer to Patent Literature 1).

In the manufacturing of a joined body, conventional technology involves use of a sheet material including sheet-form resin sandwiched between a pair of separable layers (film layers). This allows easy handling of sheet-form sealing resin. Such a sheet material is used by first removing one of the separable layers and then putting sheet-form resin in intimate contact with a surface of a substrate. Subsequently, the sheet material is peeled off, whereby resin other than that necessary is removed from the surface of the substrate along with the other one of the separable layers.

CITATION LIST

Patent Literature

Patent Literature 1

Japanese Patent Application Publication No. 2007-200591

SUMMARY

Technical Problem

When removing unnecessary resin as described above in a conventional method of manufacturing a joined body, a part of the unnecessary resin may be torn from the rest of the unnecessary resin and may remain on the substrate. Such resin residue may adhere to and thereby negatively affect other parts of the joined body being manufacturing, for example. Thus, such resin residue may lead to reduction in quality of the joined body being manufactured.

In view of the technical problem described above, the present disclosure aims to provide a method of manufacturing a joined body that yields a joined body of excellent quality, by preventing unnecessary resin from remaining on a substrate and enabling disposing sheet-form resin at a predetermined position on the substrate.

Solution to Problem

In view of the problem described above, one aspect of the present disclosure is a method of manufacturing a joined body, including: covering a first area and a second area of a first substrate with a sheet of resin in uncured state; separating a part of the sheet covering the second area from the first substrate, the separating performed after the covering; and joining the first substrate with a second substrate by arranging the second substrate to face the first substrate with a part of the sheet covering the first area between the first substrate and the second substrate, and curing the resin in the part of the sheet covering the first area, the joining performed after the separating. In the method pertaining to one aspect of the present disclosure, during the separating, a phase difference δ between stress and strain in the part of the sheet covering the second area is no greater than 48 degrees.

Advantageous Effect

In the method pertaining to one aspect of the present disclosure, the phase difference δ between stress and strain in the part of the sheet of uncured resin covering the second area of the first substrate is no greater than 48 degrees during the separating. Thus, during the separating, the sheet of uncured resin exhibits behavior of a solid material to an appropriate level. Due to this, the part of the sheet of uncured resin covering the second area is not torn when being removed.

The part of the sheet of uncured resin covering the second area, even when stress is applied thereto in being separated from the first substrate, exhibits elasticity and thus is not torn. This prevents residue of the sheet of uncured resin from remaining on the first substrate. As such, the method pertaining to one aspect of the present disclosure yields a joined body of excellent quality, by preventing unnecessary resin from remaining on the first substrate and enabling disposing sheet-form resin at a predetermined position on the first substrate.

BRIEF DESCRIPTION OF DRAWINGS

FIG. 1 illustrates a front side of an organic EL display panel in an embodiment of the present disclosure.

Each of FIGS. 3A through 3D is a cross-sectional view illustrating a step in the manufacturing of the organic EL display panel in the embodiment.

Figure 4A:
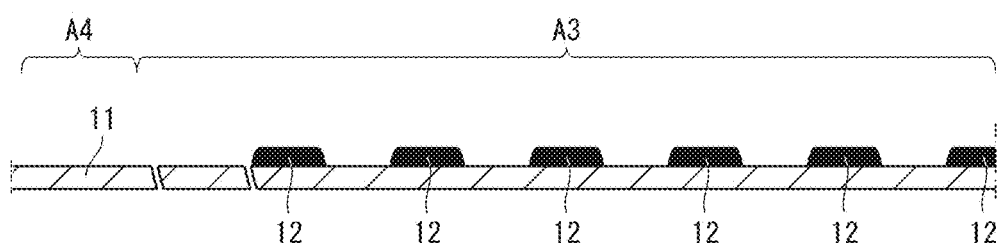
Figure 4B:
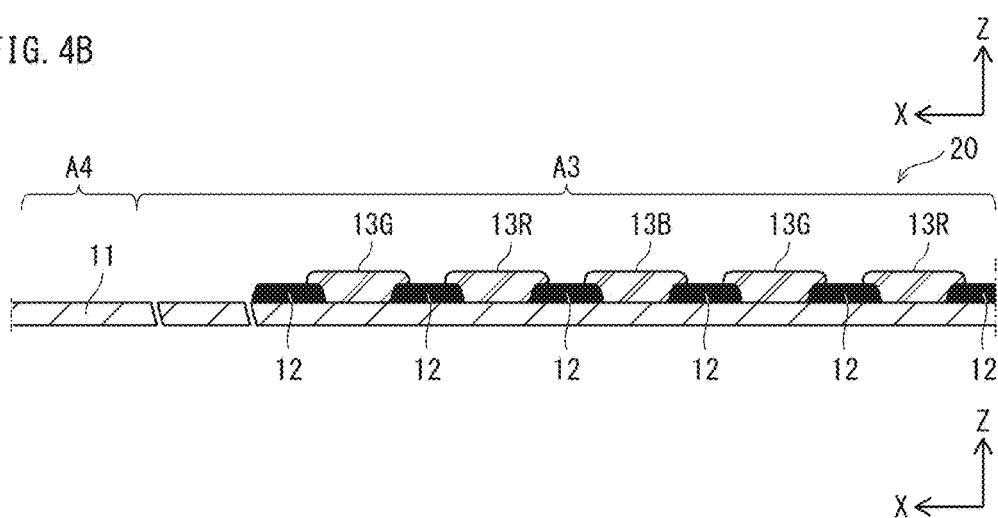

Each of FIGS. 4A and 4B is a cross-sectional view illustrating a step in the manufacturing of a CF substrate in the embodiment.

Figure 5A:
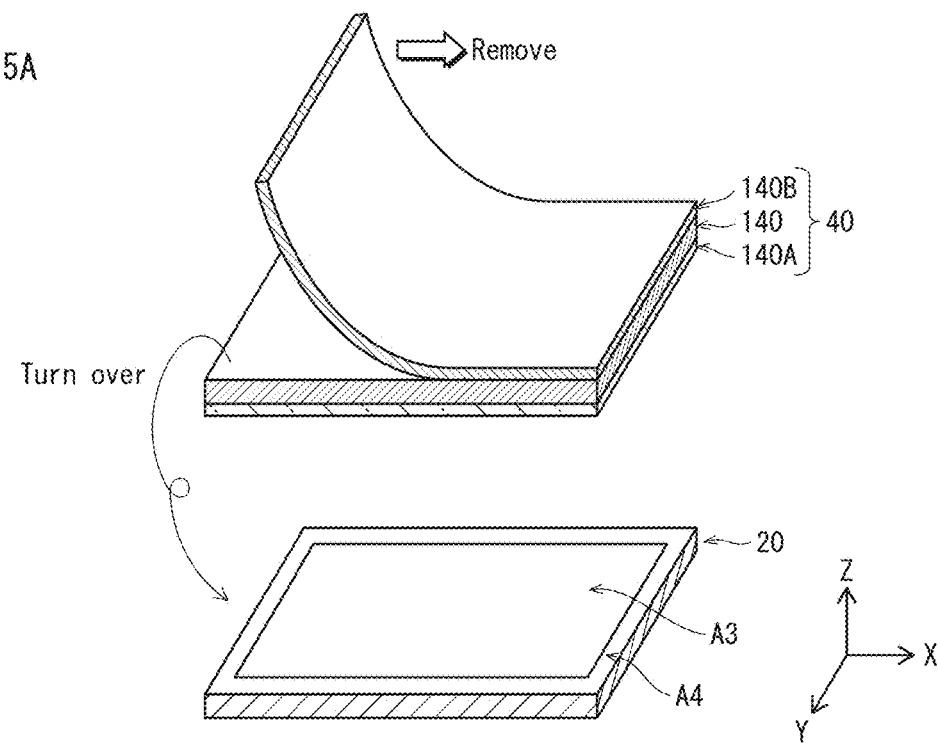
Figure 5B:
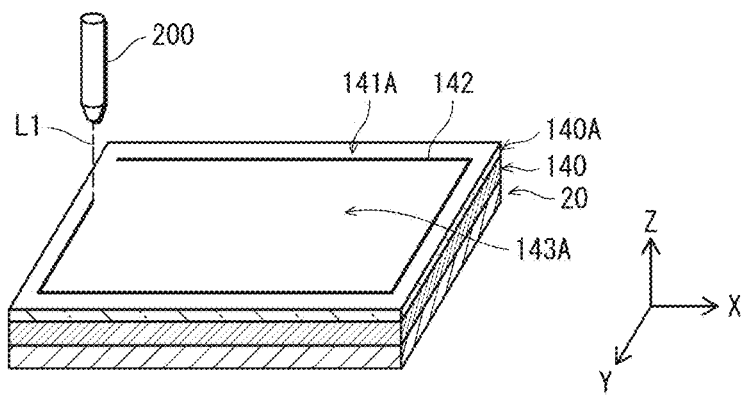
Figure 5C:
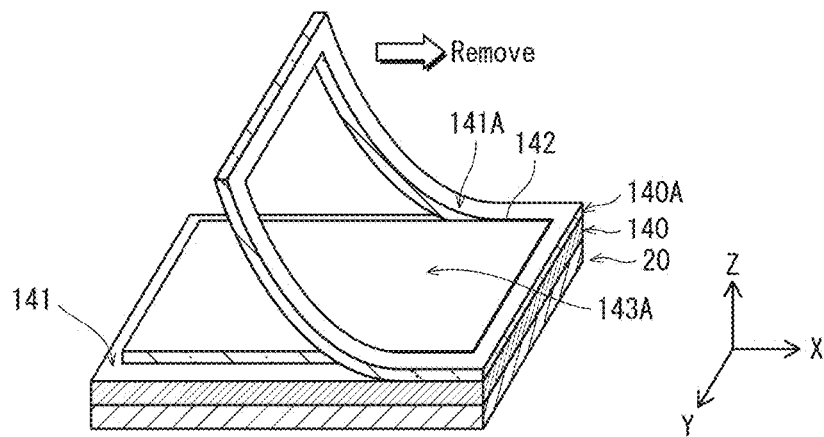

Each of FIGS. 5A through 5C is a perspective view illustrating a step in the manufacturing of the organic EL display panel in the embodiment.

Each of FIGS. 6A through 6D is a perspective view illustrating a step in the manufacturing of the organic EL display panel in the embodiment.

Each of FIGS. 7A and 7B is a cross-sectional view illustrating a step in the manufacturing of the organic EL display panel in the embodiment.

Figure 8:
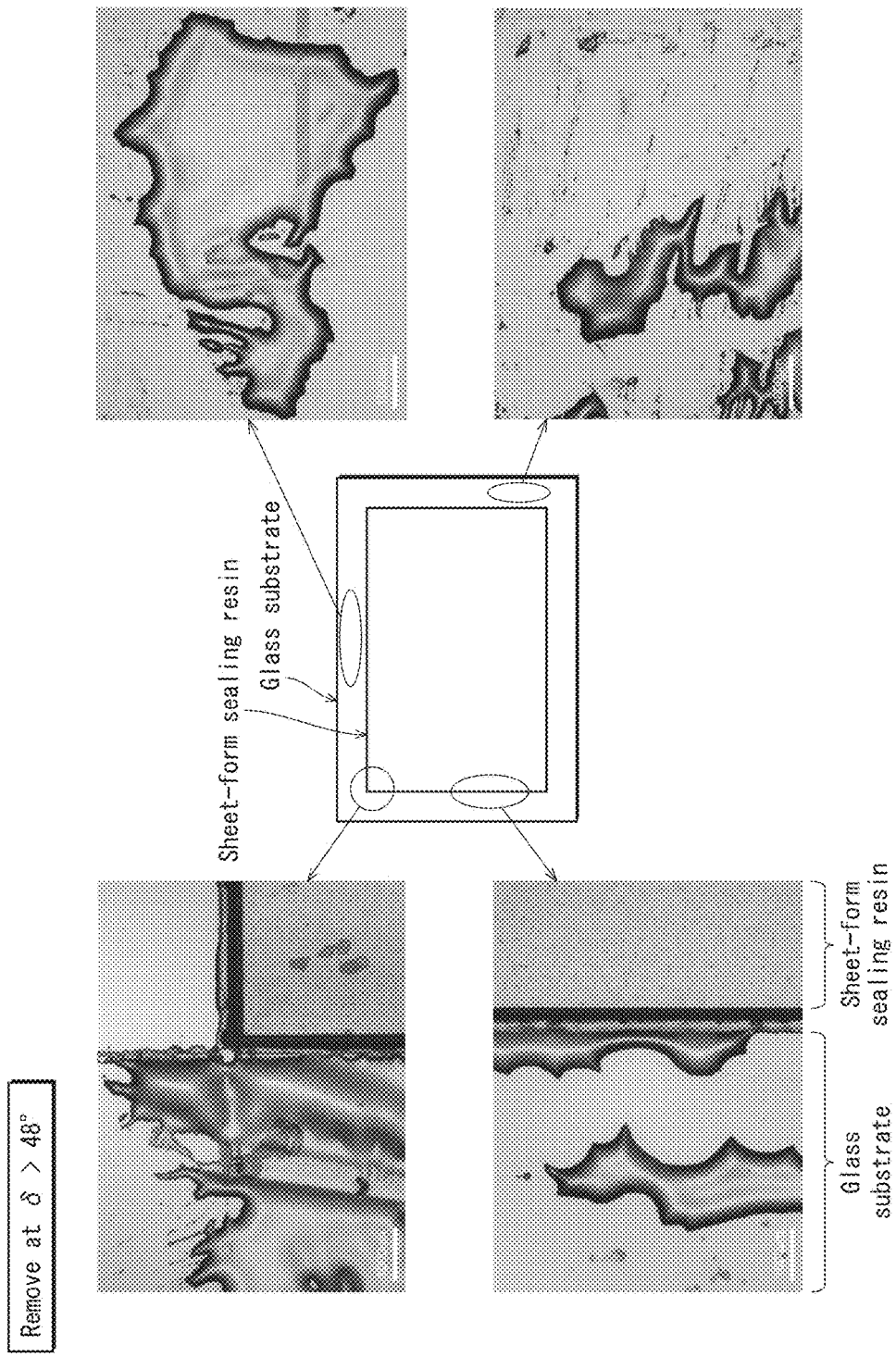

FIG. 8 includes photographs illustrating a comparative example, or more specifically, photographs indicating a state of a substrate in the comparative example immediately after removal of sheet-form sealing resin.

Figure 9:
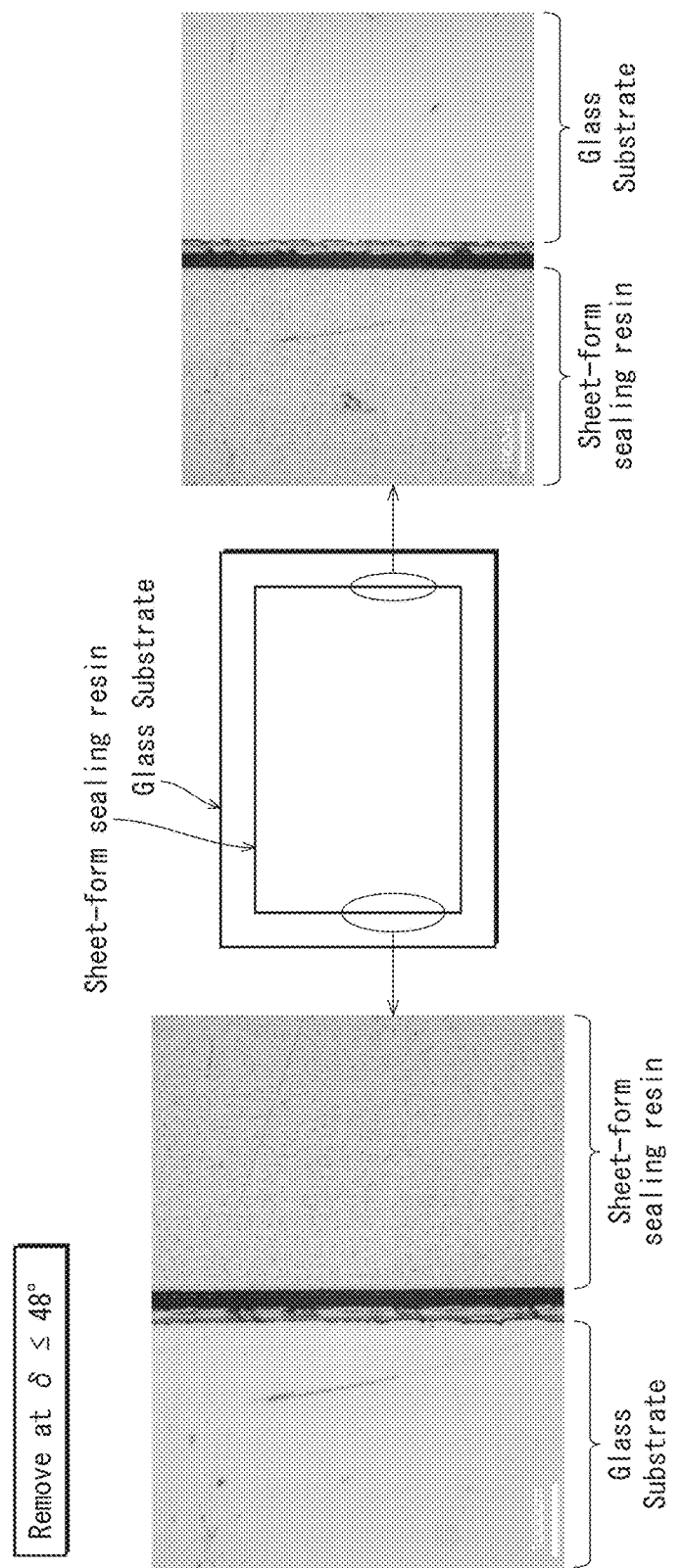

FIG. 9 includes photographs illustrating an implementation example, or more specifically, photographs indicating a state of a substrate in the implementation example immediately after removal of sheet-form sealing resin.

Figure 10:
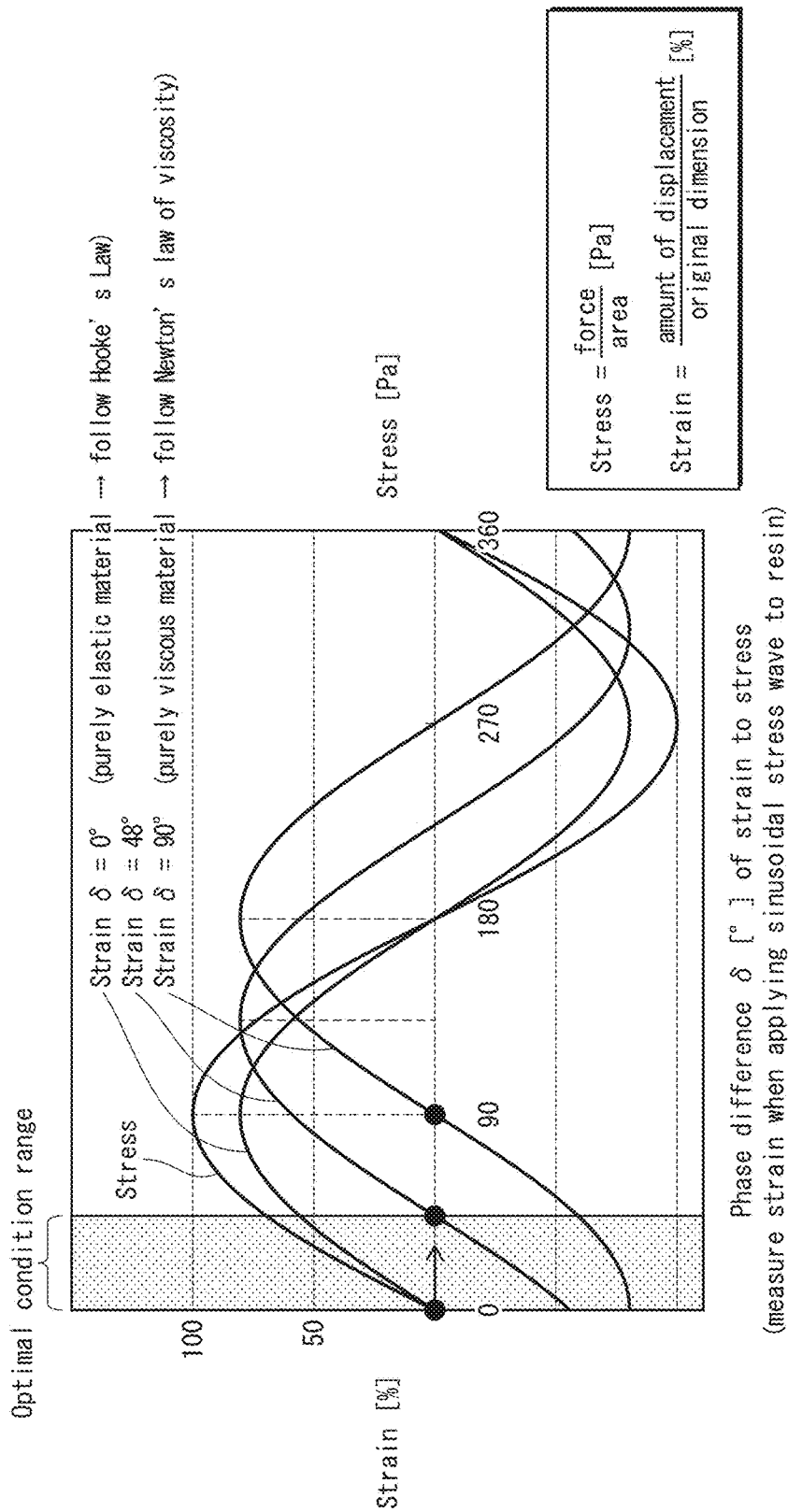

FIG. 10 is a graph indicating a sinusoidal wave of stress applied with respect to uncured sheet-form sealing resin and a sinusoidal wave of strain response to the stress.

Figure 11:
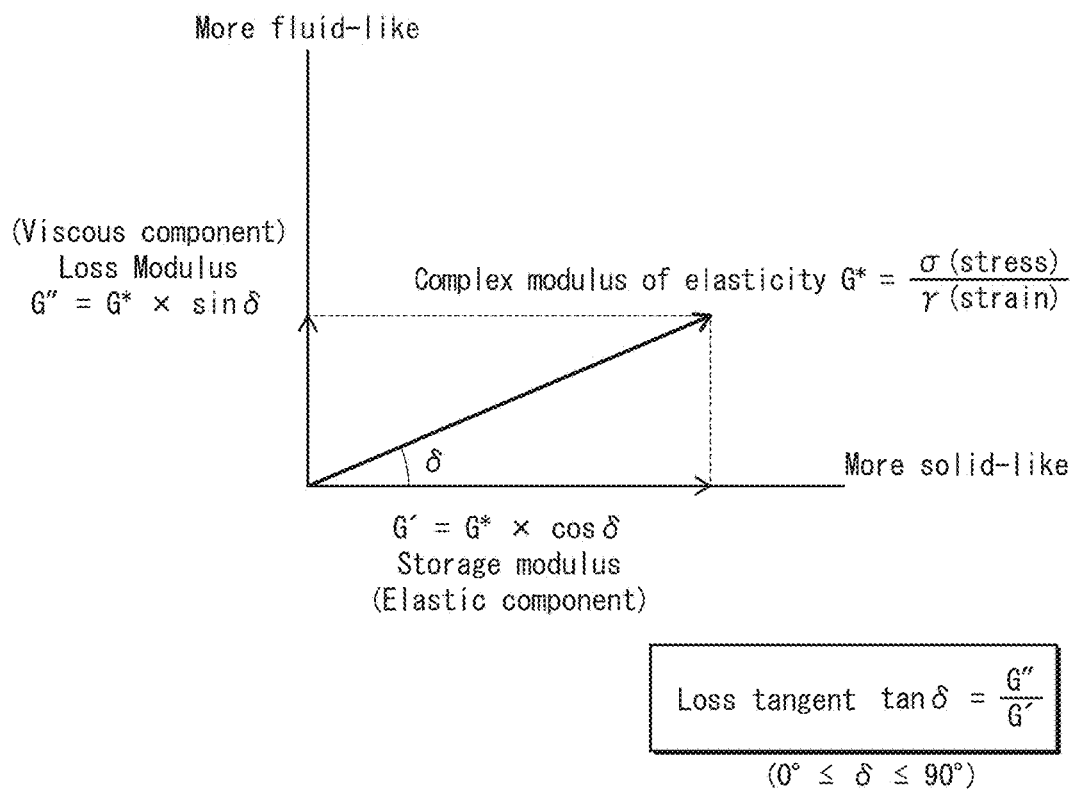

FIG. 11 is a graph indicating the relationship between a loss modulus, a storage modulus, and a complex modulus of elasticity.

Figure 12:
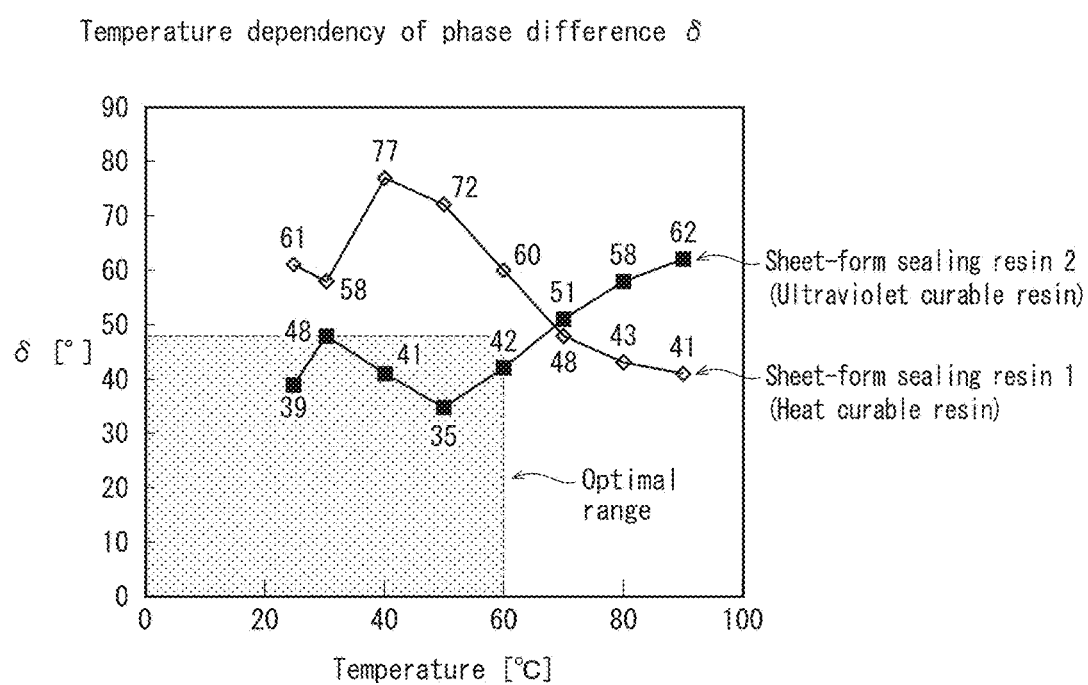

FIG. 12 is a graph indicating temperature dependency of phase difference δ in measurement targets of different sheet-form sealing resin.

Figure 13A:
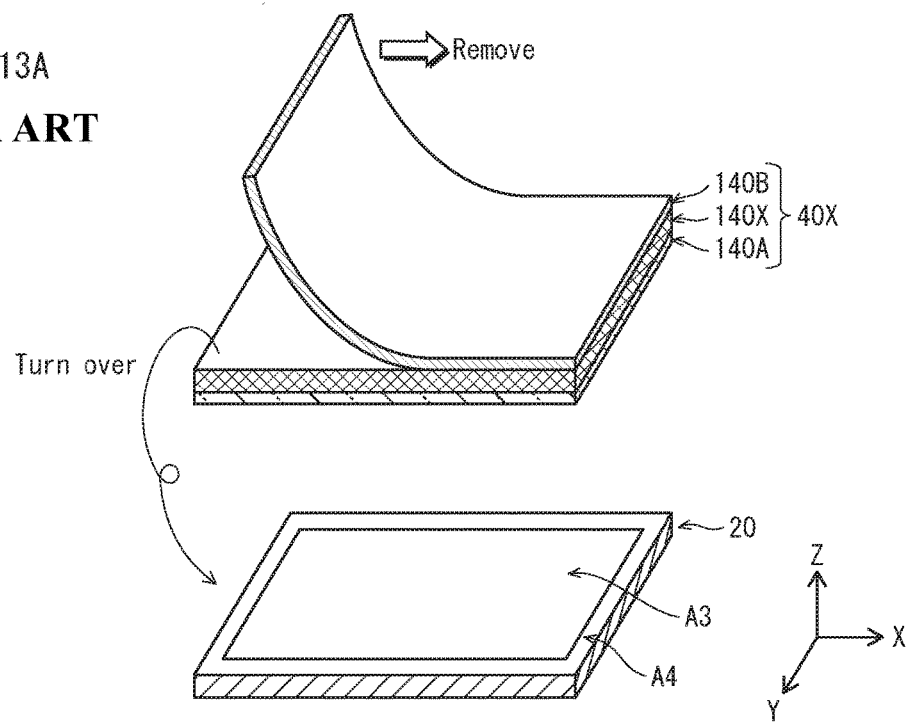
Figure 13B:
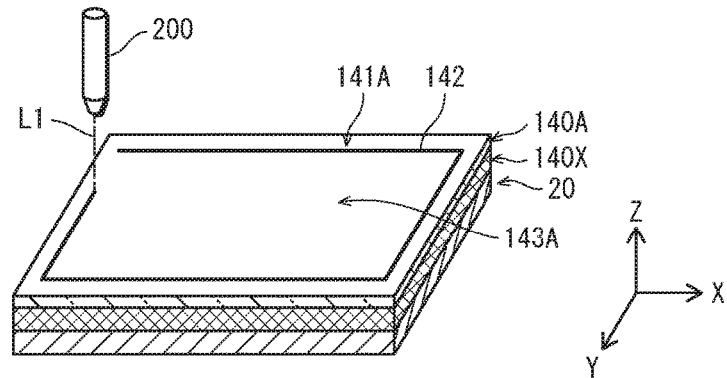
Figure 13C:
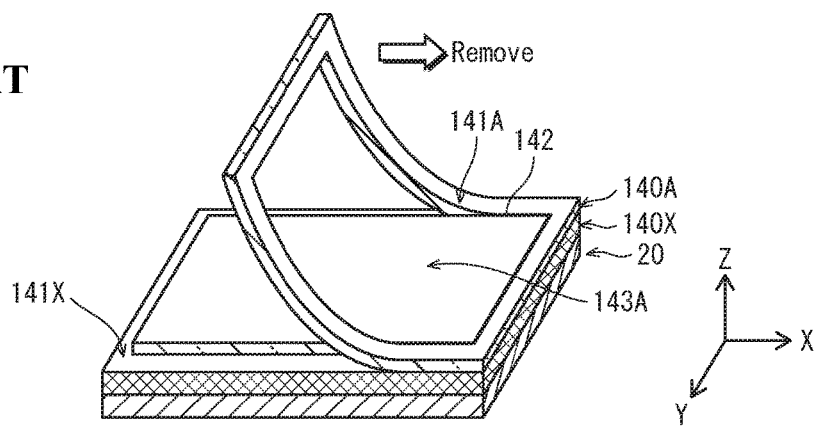

Each of FIGS. 13A through 13C is a perspective view illustrating a step in the manufacturing of a joined body.

Figure 14A:
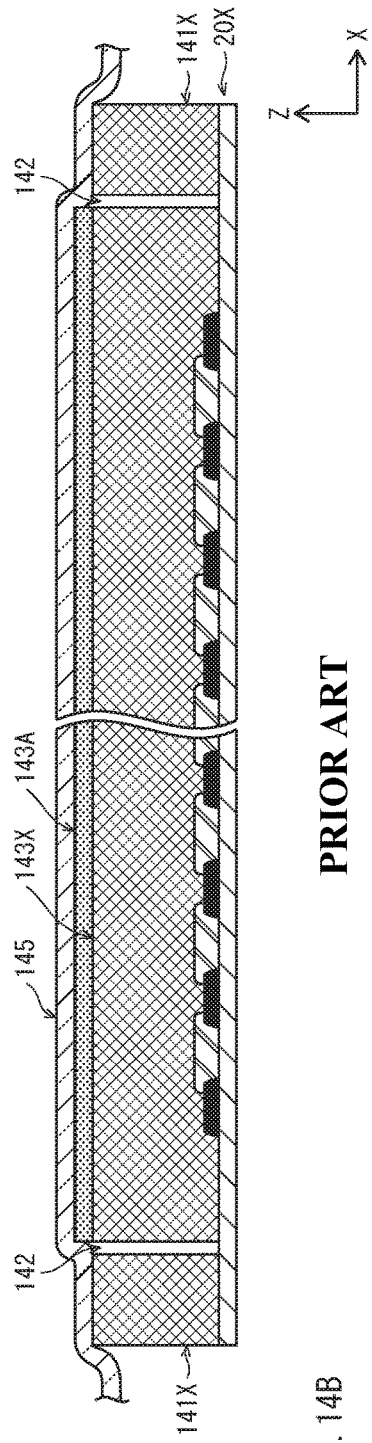
Figure 14B:
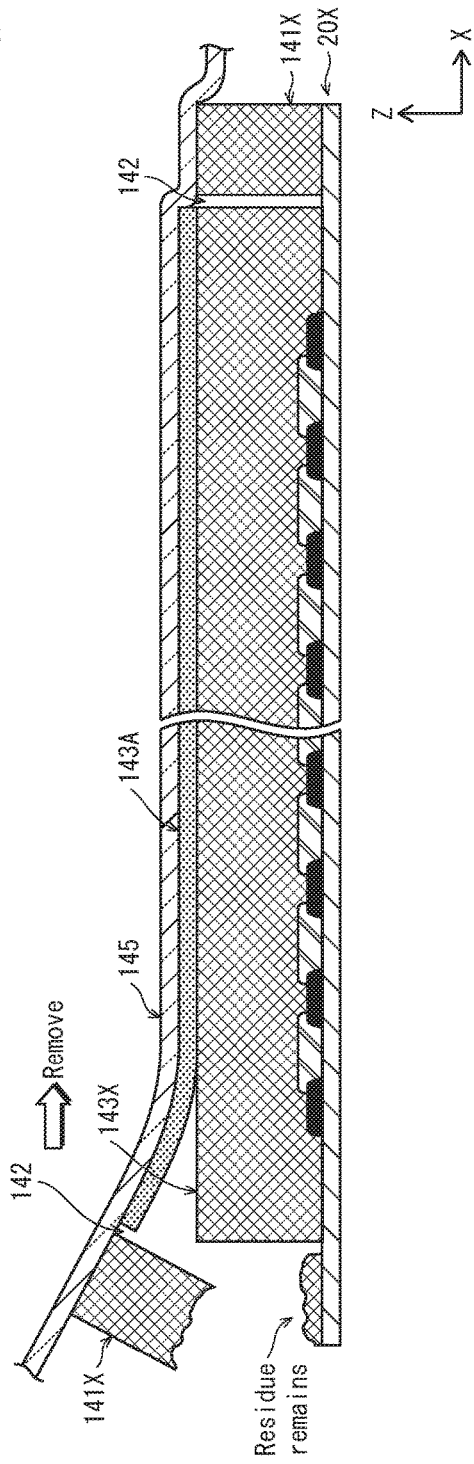

Each of FIGS. 14A and 14B is a cross-sectional view illustrating a step in the manufacturing of the joined body.

DESCRIPTION OF EMBODIMENTS

<Aspects of Present Disclosure>

One aspect of the present disclosure is a method of manufacturing a joined body, including: covering a first area and a second area of a first substrate with a sheet of resin in uncured state; separating a part of the sheet covering the second area from the first substrate, the separating performed after the covering; and joining the first substrate with a second substrate by arranging the second substrate to face the first substrate with a part of the sheet covering the first area between the first substrate and the second substrate, and curing the resin in the part of the sheet covering the first area, the joining performed after the separating. In the method pertaining to one aspect of the present disclosure, during the separating, a phase difference δ between stress and strain in the part of the sheet covering the second area is no greater than 48 degrees.

In the method pertaining to one aspect of the present disclosure, during the separating, the part of the sheet covering the second area may have a temperature no greater than 60 degrees Celsius.

In the method pertaining to one aspect of the present disclosure, the resin may contain ultraviolet curable resin.

In the method pertaining to one aspect of the present disclosure, the resin may contain heat curable resin.

In the method pertaining to one aspect of the present disclosure, before the separating, the phase difference δ between stress and strain in the part of the sheet covering the second area may be greater than 48 degrees.

In the method pertaining to one aspect of the present disclosure, the resin may contain at least one of acrylic resin, epoxy resin, silicone resin, and olefin resin.

The method pertaining to one aspect of the present disclosure may further include cutting the sheet at a boundary between the first area and the second area, the cutting performed after the covering and before the separating, and in the method pertaining to one aspect of the present disclosure, the first area and the second area may be adjacent areas.

In the method pertaining to one aspect of the present disclosure, the separating may be performed by adhering a removal tape to the part of the sheet covering the second area and removing, away from the first substrate, the part of the sheet covering the second area along with the removal tape.

In the method pertaining to one aspect of the present disclosure, the covering may be performed by disposing, with respect to the first substrate, a sheet material that is a laminate including the sheet and a separable layer, and thereby covering the first area and the second area with the sheet, the cutting may be performed by radiating a laser beam from outside the separable layer and cutting both the sheet and the separable layer at the boundary between the first area and the second area with the laser beam, and the separating may be performed by removing a part of the separable layer covering the second area, adhering the removal tape to extend over the part of the sheet covering the second area and a part of the separable layer covering the first area, and removing, away from the first substrate, the part of the sheet covering the second area and the part of the separable layer covering the first area along with the removal tape.

In the method pertaining to one aspect of the present disclosure, an area of the second substrate facing the first area may have a plurality of light-emission elements disposed therein.

In the method pertaining to one aspect of the present disclosure, the first area may have a plurality of color filter layers disposed therein.

In the method pertaining to one aspect of the present disclosure, the second area may surround the first area.

<<<Matters Underlying Embodiment>>>

In the following, description is provided on the matters underlying the embodiment, or more specifically, on the study performed with respect to a typical method of manufacturing a joined body by using a sheet material. In the following, description is provided with reference to FIGS. 13A through 13C, each of which being a perspective view illustrating a step in the manufacturing method, and FIGS. 14A and 14B, each of which being a cross-sectional view illustrating a step in the manufacturing method.

In the manufacturing of a joined body, first, a sheet material 40X is prepared, as illustrated in FIG. 13A. The sheet material 40X includes a pair of separable layers (a first separable layer 140A and a second separable layer 140B) and uncured sheet-form sealing resin 140X sandwiched between the pair of separable layers. For example, the uncured sheet-form sealing resin 140X may be ultraviolet curable resin or heat curable resin.

Subsequent removal of the second separable layer 140B exposes one face of the uncured sheet-form sealing resin 140X. Then, the uncured sheet-form sealing resin 140X is turned over, and the exposed face of the uncured sheet-form sealing resin 140X is put in intimate contact with a surface of a first substrate 20X.

Subsequently, a laser beam is radiated from outside the first separable layer 140A to cut the first separable layer 140A and the uncured sheet-form sealing resin 140X at the same time, as illustrated in FIG. 13B. In FIGS. 13B and 14A, reference sign 142 indicates the trace left by the laser beam (areas that are cut by the laser beam). The laser beam forms, inside the laser beam trace 142, non-removal resin 143X and a first separable layer inner part 143A covering the non-removal resin 143X, and forms, outside the laser beam trace 142, unnecessary resin 141X and a first separable layer outer part 141A covering the unnecessary resin 141X (FIG. 13B).

Subsequently, the first separable layer outer part 141A is removed as illustrated in FIG. 13C, and a removal tape 145 is adhered to extend entirely over the first separable layer inner part 143A and the unnecessary resin 141X, as illustrated in FIG. 14A. Then, as illustrated in FIG. 14B, the removal tape 145 is removed away from the first substrate 20X in the X direction from one end to the other of the first substrate 20X, along with the unnecessary resin 141X and the first separable layer inner part 143A. Thus, the unnecessary resin 141X is removed, and the non-removal resin 143X remains on the first substrate 20X.

Following this, an undepicted second substrate is arranged to face the first substrate 20X with the non-removal resin 143X located between the first substrate 20X and the second substrate. Further, heating, etc., of the non-removal resin 143X is performed, whereby the non-removal resin 143X is cured and a resin sealing layer is formed. Thus, a joined body is yielded.

In such a typical method of manufacturing a joined body, when unnecessary resin of a sheet material is removed from a substrate, a part of the unnecessary resin may be torn and may remain on the substrate.

In view of such a problem, the present disclosure provides a method of manufacturing a joined body that yields a joined body of excellent quality, by preventing unnecessary resin from remaining on a substrate and enabling disposing sheet-form resin at a predetermined position on the substrate.

<Embodiment>

The following describes an organic EL display panel 100 pertaining to an embodiment in the present disclosure, which is one example of a joined body pertaining to the present disclosure.

(Organic EL Display Panel 100)

FIG. 1 illustrates a front side of an organic EL display panel 100 (in the following, simply referred to as a "panel 100"). In specific, FIG. 1 is an X-Y plane view illustrating the front side of the panel 100, which includes pixels of the organic EL display panel 100 and areas around the pixels.

Figure 2:
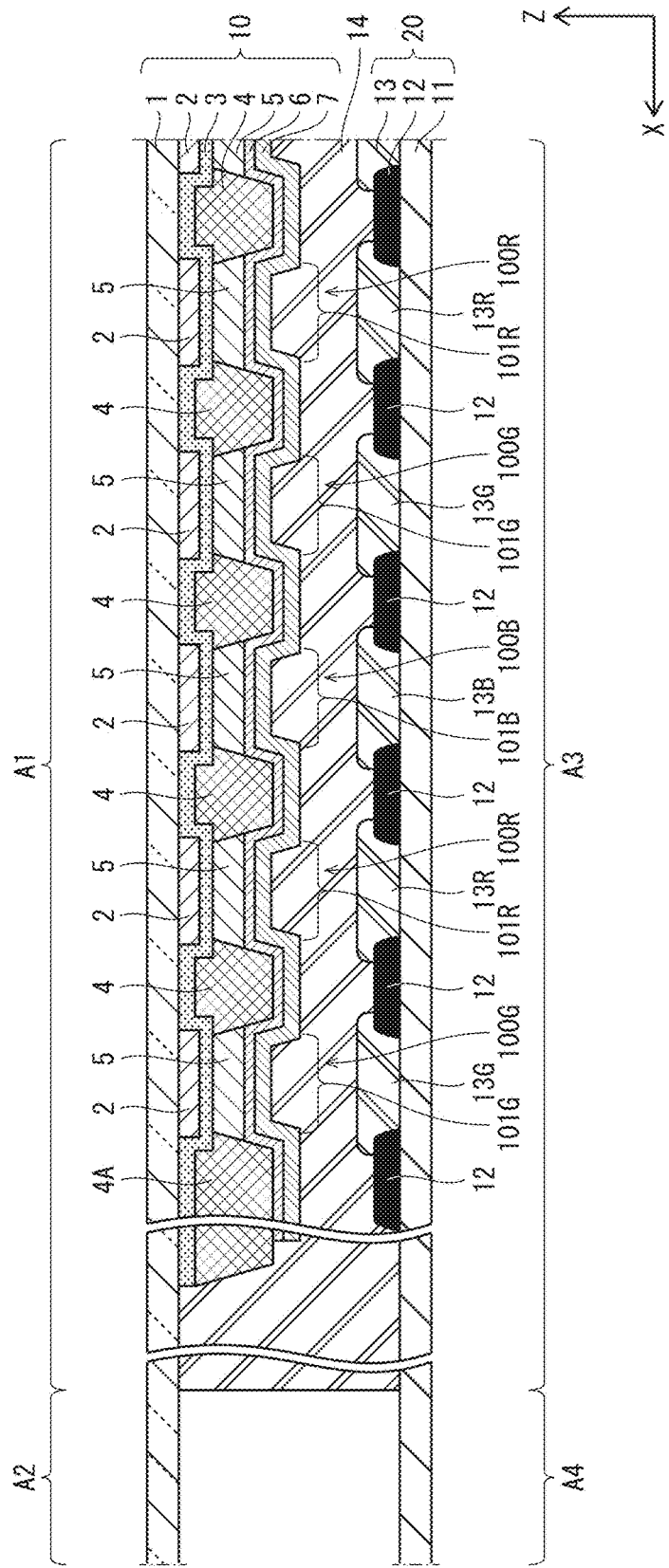
FIG. 2 illustrates a cross-section of the organic EL display panel in the embodiment.

FIG. 2 is an X-Z plane cross-sectional view illustrating a cross-section of the panel 100 along line W1-W2 in FIG. 1.

As illustrated in FIG. 1, the panel 100 is a display whose main surface has a rectangular overall shape. The following provides description on the overall structure of the panel 100. As illustrated in FIG. 2, the panel 100 includes a first substrate (an EL substrate 10), a second substrate (a CF substrate 20) and a resin sealing layer 14. The EL substrate 10 is joined together with the CF substrate 20 via the resin sealing layer 14. Thus, the panel 100 is a joined body. Note that in FIG. 1, the panel 100 is illustrated with the CF substrate 20 on the front side and with the EL substrate 10 on the rear side.

[EL Substrate 10]

As illustrated in FIG. 1, the EL substrate 10 has a light-emission area A1 for screen display and a peripheral area A2 that is adjacent to the light-emission area A1 and surrounds the light-emission area A1.

As illustrated in FIG. 2, within the light-emission area A1, a plurality of barrier walls (banks) 4 and a plurality of organic EL elements 100R, 100G, 100B are disposed. The organic EL elements 100R correspond to light-emission color R (red), the organic EL elements 100G correspond to light-emission color G (green), and the organic EL elements 100B correspond to light-emission color B (blue). The organic EL elements 100R, 100G, 100B are each disposed repeatedly in the X direction. Specifically, the organic EL elements 100R, 100G, 100B are formed with respect to openings 101R, 101G, 101B, respectively. The openings 101R, 101G, 101B are formed between adjacent barrier walls (banks) 4. Note that each organic EL element (100R, 100G, 100B) is one sub-pixel of the panel 100. Further, a set of one organic EL element 100R, one organic EL element 100G, and one organic EL element 100B that are adjacent to one another forms one pixel of the panel 100.

Each organic EL element (100R, 100G, 100B) includes a TFT substrate 1 (in the following, simply referred to as "substrate 1") and layers disposed above an upper surface of the TFT substrate 1. Namely, an anode 2, a hole injection layer 3, an organic light-emission layer 5, an electron transport layer 6, and a cathode 7 are disposed in the stated order above the upper surface of the TFT substrate 1.

Each organic EL element (100R, 100G, 100B) includes a separate anode 2 and a separate organic light-emission layer 5. Meanwhile, the hole injection layer 3, the electron transport layer 6, and the cathode 7 are continuous layers each covering the substrate 1 entirely. In the panel 100, the organic EL elements 100R, 100G, 100B are top-emission type organic EL elements due to the anodes 2 being formed by using material reflecting visible light and the cathode 7 being formed by using material transmitting visible light. Meanwhile, forming the substrate 1 and the anodes 2 by using material transmitting visible light and the cathode 7 by using material reflecting visible light results in the organic EL elements 100R, 100G, 100B being bottom-emission type organic EL elements.

Note that within the light-emission area A1, auxiliary wiring areas may be disposed along the Y direction, one for each pixel or one for each set of several pixels, for example.

[CF Substrate 20]

As illustrated in FIG. 1, the CF substrate 20 has a first area A3 and a second area A4 that is adjacent to the first area A3 and surrounds the first area A3. The first area A3 faces the light-emission area A1 of the EL substrate 10, and the second area A4 faces the peripheral area A2 of the EL substrate 10.

As illustrated in FIG. 2, the CF substrate 20 includes a base substrate 11, and on an upper surface of the base substrate 11, a plurality of black matrices (BMs) 12, a plurality of color filter (CF) layers 13R, a plurality of color filter layers 13G, and a plurality of color filter layers 13B. The black matrices 12 are each disposed at a position corresponding to that of a barrier wall 4 of the EL substrate 10. Further, each color filter layer (13R, 13G, 13B) is disposed at a position corresponding to that of an organic light-emission layer 5 of the EL substrate 10. The black matrices 12 and the color filter layers 13R, 13G, 13B are formed within the first area A3 of the CF substrate 20.

[Resin Sealing Layer 14]

The resin sealing layer 14 is a sealing layer that covers the light-emission area A1 of the EL substrate 10 and the first area A3 of the CF substrate 20 and thereby provides tight sealing between the light-emission area A1 and the first area A3. For example, the resin sealing layer 14 contains heat curable resin or energy ray curable resin, such as ultraviolet curable resin.

(Method of Manufacturing Panel 100)

The following describes a method of manufacturing the panel 100, with reference to cross-sectional views illustrating steps in the manufacturing of the panel 100 (FIGS. 3A through 3D, FIGS. 4A and 4B, and FIGS. 7A and 7B) and perspective views illustrating steps in the manufacturing of the panel 100 (FIGS. 5A through 5C and FIGS. 6A through 6D).

To provide an overall explanation of the manufacturing of the panel 100, the EL substrate 10 and the CF substrate 20 are first prepared. Then, a sheet-form sealing resin-provided CF substrate 30 (refer to FIG. 6C) is prepared. Finally, manufacturing of the panel 100 is completed by joining the EL substrate 10 with the sheet-form sealing resin-provided CF substrate 30.

[Preparation of EL Substrate 10]

First, a metal thin film containing Ag, for example, is formed at a predetermined area on the substrate 1 (i.e., the light-emission area A1). For example, the forming of the metal thin film is performed by sputtering or vapor deposition. The anodes 2 are formed on the substrate 1 with a predetermined distance between one another by patterning the metal thin film by photolithography.

Subsequently, a thin film containing a transition metal is formed so as to cover entirely the light-emission area A1, within which the anodes 2 have been formed. For example, the forming of the thin film containing a transition metal is performed by sputtering. The hole injection layer 3 is formed by oxidizing the thin film containing a transition metal.

Figure 3A:
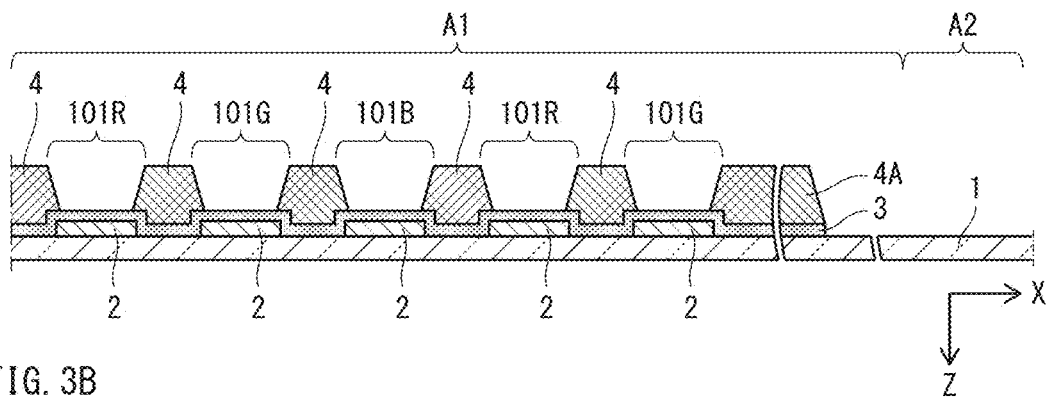

Then, a layer of barrier wall material is disposed on the surface of the hole injection layer 3. For example, the forming of the barrier wall material layer is performed by spin-coating. Subsequently, a photosensitive resist layer containing ultraviolet curable resin, acrylic resin, polyimide resin, or novolac-type phenolic resin, for example, is disposed to cover the barrier wall material layer entirely. By performing exposure using a pattern mask based on photolithography, some parts of the barrier wall material layer are hardened. Subsequently, developing and baking of the barrier wall material layer are performed in the stated order, to form the barrier walls 4, 4A and the openings 101R, 101G, 101B (FIG. 3A).

Figure 3B:
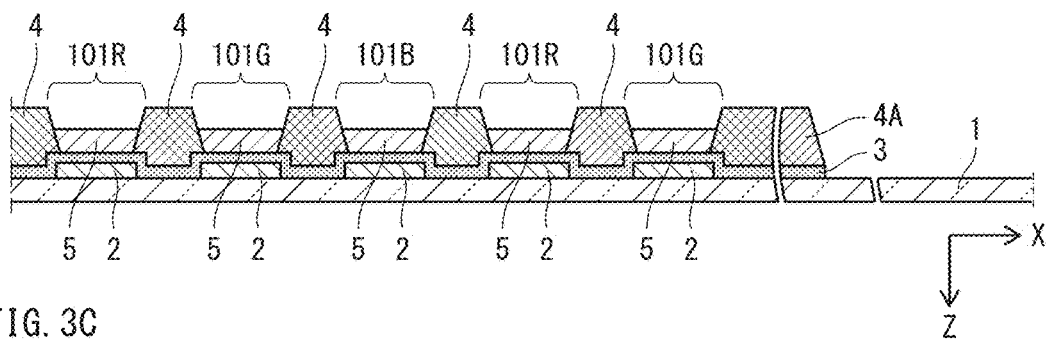

Following this, ink containing an organic light-emission material and a solvent is prepared. The ink is applied with respect to each opening (101R, 101G, 101B) between adjacent barrier walls (4, 4A). The application of the ink is performed through a wet process based on the inkjet method. The organic light-emission layers 5 are formed by causing the ink solvent to evaporate (FIG. 3B).

Figure 3C:
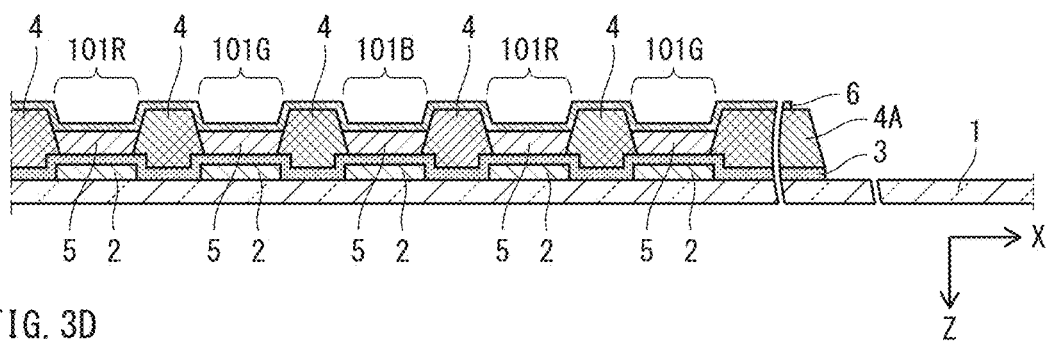
Figure 3D:
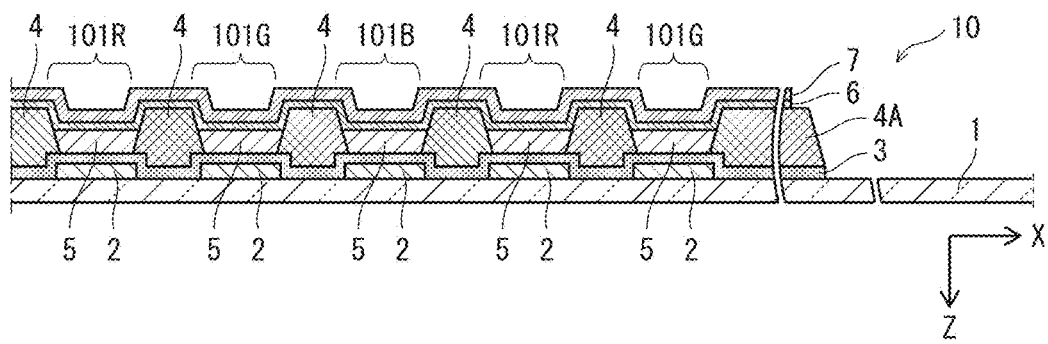

Subsequently, the electron transport layer 6 is formed to cover the organic light-emission layers 5 and the barrier walls (4, 4A) entirely (FIG. 3C). For example, the forming of the electron transport layer 6 is performed by vapor deposition. Further, the cathode 7 is formed on the electron transport layer 6 (FIG. 3D). The forming of the cathode 7 is performed in a similar way as the forming of the electron transport layer 6, i.e., by vapor deposition for example.

This completes the manufacturing of the EL substrate 10.

[Preparation of CF Substrate 20]

First, the base substrate 11 is prepared by using glass material. Then, ultraviolet/heat curable sealing resin material containing a black pigment is applied with respect to a predetermined area on a surface of the base substrate 11 (i.e., the first area A3). The black matrices 12 are formed by performing patterning based on photolithography (FIG. 4A). Here, the black matrices 12 are disposed at positions corresponding to positions of the barrier walls 4 of the EL substrate 10.

Subsequently, ink containing color filter material of one of the colors R, G, B is applied with respect to each area between adjacent black matrices 12. Here, the color of the color filter material applied with respect to a given area is determined based on the color of an opening (101R, 101G, 101B) of the EL substrate 10 corresponding in position to the given area. Then, the color filter layers 13R, 13G, 13B are formed by causing ink solvent to evaporate (FIG. 4B).

This completes the manufacturing of the CF substrate 20.

[Preparation of Sheet-Form Sealing Resin-Provided CF Substrate 30]

Subsequently, the sheet-form sealing resin-provided CF substrate 30 is prepared by using the CF substrate 20 and performing the following steps in the stated order. The steps include: a preparing step; a covering step; a cutting step; a separating step; and a joining step.

(Preparing Step)

In this step, as illustrated in FIG. 5A, a sheet material 40 is prepared. The sheet material 40 includes a first separable layer 140A (a resin film layer of relatively great thickness), a second separable layer 140B (a resin film layer of relatively small thickness), and uncured sheet-form sealing resin 140 between the first separable layer 140A and the second separable layer 140B. For example, the uncured sheet-form sealing resin 140 contains heat curable resin or energy ray curable resin, such as ultraviolet curable resin. To provide a specific example, the uncured sheet-form sealing resin 140 contains at least one of acrylic resin, epoxy resin, and silicone resin. Note that a characteristic of this embodiment is that the uncured sheet-form sealing resin 140 is configured such that a phase difference δ between stress and strain in the uncured sheet-form sealing resin 140 during the separating step is no greater than 48 degrees. Further, as already described above, the sheet material has separable layers (i.e., the separable layer 140A and the separable layer 140B) that are disposed to sandwich the uncured sheet-form sealing resin 140. In the following, one of the separable layers that has relatively low removability (the first separable layer 140A in this example) is referred to as a "heavy separable layer", while the other one of the separable layers that has relatively high removability (the second separable layer 140B) is referred to as a "light separable layer". Note that the difference in removability between the separable layers derives from the different characteristics of the separable layers, such as the different thicknesses of the separable layers and the characteristics of different release agents used.

(Covering Step)

In this step, the second separable layer 140B of the sheet material 40 is first removed. Removal of the second separable layer 140B exposes one surface of the uncured sheet-form sealing resin 140. Then, the uncured sheet-form sealing resin 140 is turned over, and the exposed surface of the uncured sheet-form sealing resin 140 is put in intimate contact with the entirety of a surface of the CF substrate 20 on which the black matrices 12 and the color filter layers 13R, 13G, 13B are formed (FIG. 5A). Thus, the first area A3 and the second area A4 are each covered entirely by the uncured sheet-form sealing resin 140. Note that instead of turning over the uncured sheet-form sealing resin 140 and the first separable layer 140A as illustrated in FIG. 5A, the CF substrate 20 may be turned over and put in intimate contact with the uncured sheet-form sealing resin 140.

(Cutting Step)

In this step, an energy ray is radiated with respect to the uncured sheet-form sealing resin 140 from outside the first separable layer 140A to cut the first separable layer 140A and the uncured sheet-form sealing resin 140.

In specific, first, adjustment is performed of a laser output level of a laser radiation apparatus. Here, the laser output level is adjusted such that a laser beam radiated by the laser radiation apparatus cuts the first separable layer 140A and the uncured sheet-form sealing resin 140 but does not damage the CF substrate 20. To provide one example of the laser output level, when the thickness of the first separable layer 140A and the uncured sheet-form sealing resin 140 is 50 μm and 20-30 μm, respectively, the energy density of the laser beam is adjusted within a range of at least 40 mJ/cm$^2$ to at most 65 mJ/cm$^2$.

Following the adjustment as described above, as illustrated in FIGS. 5B and 7A, a boundary (refer to FIG. 5A) between the first area A3 and the second area A4 is irradiated with a laser beam L1 from outside the first separable layer 140A. The laser beam L1 is radiated from a processing head 200 of the laser radiation apparatus. Moving the processing head 200 such that the irradiation position moves along the boundary between the first area A3 and the second area A4 results in areas of the first separable layer 140A and the uncured sheet-form sealing resin 140 directly below a laser beam trace 142 being cut at the same time. The laser beam L1 forms non-removal resin 143 and a first separable layer inner part 143A covering the non-removal resin 143 (refer to FIG. 7A). In addition, the laser beam forms unnecessary sealing resin 141 and a first separable layer outer part 141A covering the unnecessary sealing resin 141 (refer to FIG. 5C).

(Separating Step)

The separating step includes the following steps performed in the stated order: a first separable layer outer part removing step; a tape adhesion step of adhering a tape for removing unnecessary resin; and a removing step.

[First Separable Layer Outer Part Removing Step]

In this step, as illustrated in FIG. 5C, the first separable layer outer part 141A is removed in one direction (the X direction in this example) from one end thereof towards the other end thereof (from the left side end to the right side end in this example). Here, to ensure removal of the first separable layer output part 141A, it is preferable to remove the first separable layer outer part 141A by peeling off the first separable layer outer part 141A starting from one end thereof and finishing at the other end thereof. The removal of the first separable layer outer part 141A results in the unnecessary sealing resin 141 being exposed.

[Tape Adhesion Step]

Figure 6A:
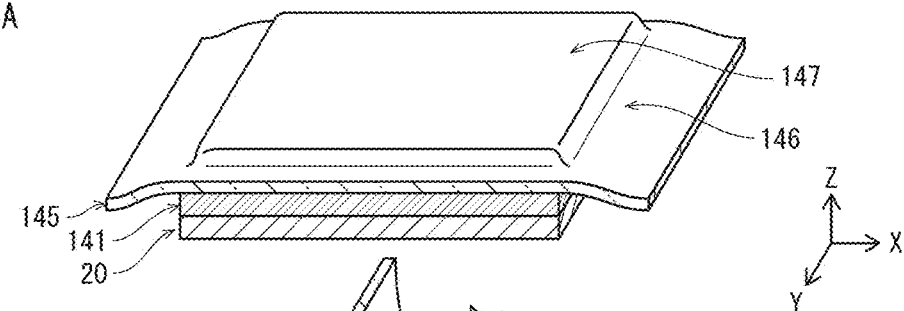

In this step, a removal tape 145 is adhered to extend entirely over the surface of the first separable layer inner part 143A and the surface of the unnecessary sealing resin 141 (FIGS. 6A and 7A). In this process, a tape adhesion part 146 of the removal tape 145 is put in intimate contact with the unnecessary sealing resin 141, and a tape adhesion part 147 of the removal tape 145 is put in intimate contact with the first separable layer inner part 143A.

[Removing Step]

Figure 6B:
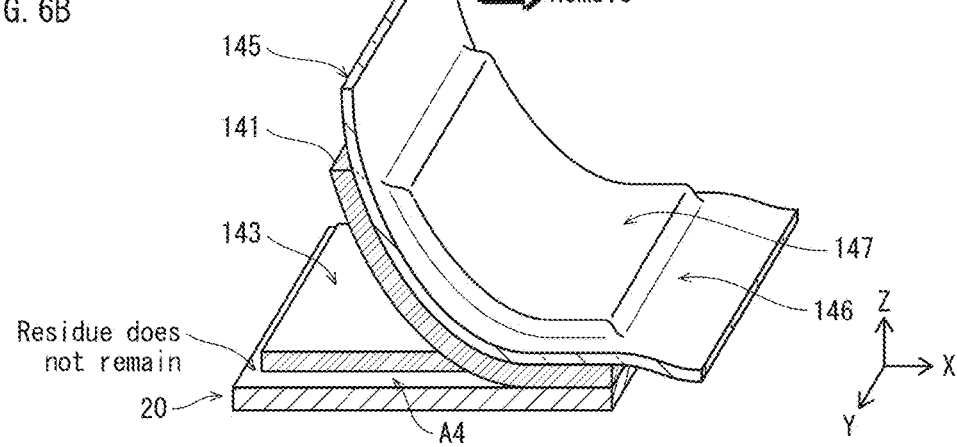

In this step, the removal tape 145 is removed away from the CF substrate 20 in one direction (the X direction in this example) from one end to the other of the CF substrate 20, along with the unnecessary sealing resin 141 and the first separable layer inner part 143A (FIGS. 6B and 7B).

Note that the unnecessary sealing resin 141 is characterized in that, during the removal of the removal tape 145, the phase difference δ between stress and strain (also referred to simply as "the phase difference δ" in the following) in the unnecessary sealing resin 141 is no greater than 48 degrees, and thus, the unnecessary sealing resin 141 exhibits behavior of a solid material to an appropriate extent. Due to this, the unnecessary sealing resin 141 is not torn while being removed. Thus, the unnecessary sealing resin 141 accompanies the movement of the removal tape 145 being peeled off from the CF substrate 20, and is removed away from the CF substrate 20 along with the removal tape 145 without being torn into small pieces, or in other words, while maintaining its form as a single body. Thus, residue of the unnecessary sealing resin 141 is prevented from remaining on the CF substrate 20. Thus, the embodiment, due to enabling disposing resin (i.e., the non-removal resin 143) only on the first area A3 of the CF substrate 20, prevents degradation of quality of the panel 100 brought about by residue of the unnecessary sealing resin 141 adhering to unnecessary parts of the panel 100 (a joined body).

Here, note that it suffices for the phase difference δ to be no greater than 48 degrees at least in a part of the uncured sheet-form resin 140 that is removed away from the CF substrate 20 in the separating step (i.e., the unnecessary sealing resin 141 in this example). Meanwhile, the embodiment is an example of a case where the phase difference δ is no greater than 48 degrees in the entirety of the uncured sheet-form resin 140.

Figure 6C:
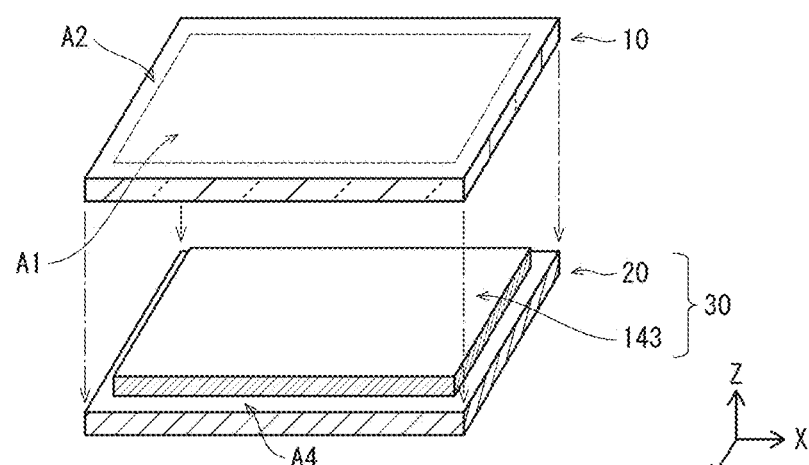

The completion of the removing step yields the sheet-form sealing resin-provided CF substrate 30, which is illustrated in FIG. 6C.

(Joining Step)

In this step, as illustrated in FIG. 6C, the EL substrate 10 is arranged with respect to the upper surface of the sheet-form sealing resin-provided CF substrate 30 such that the light-emission area A1 faces the non-removal resin 143. Then, a cathode-side face of the EL substrate 10 is put in contact with the non-removal resin 143. Thus, the light-emission area A1 is covered by the non-removal resin 143.

Figure 6D:
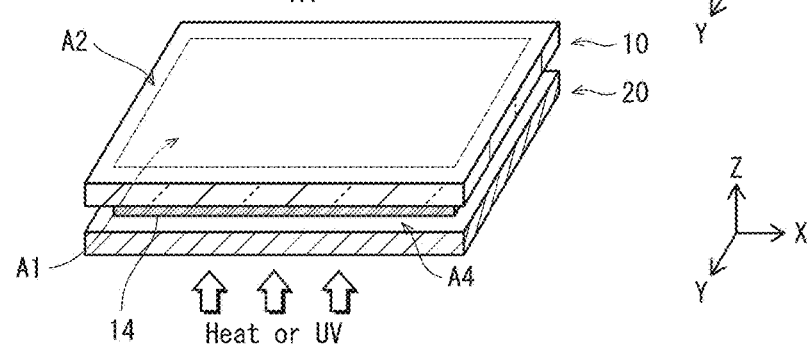

Subsequently, curing of the non-removal resin 143 is performed by heating the non-removal resin 143 from the side of the CF substrate 20 or by irradiating the non-removal resin 143 with an ultraviolet ray from the side of the CF substrate 20. Accordingly, the resin sealing layer 14 is formed (FIG. 6D).

Thus, the manufacturing of the panel 100 is completed.

<Confirmation of Effects of Separating Step>

FIG. 8 includes photographs illustrating a comparative example, which is formed by first disposing typical uncured sheet-form sealing resin (wherein δ>48°) with respect to first and second areas of a first substrate composed of a glass substrate, and then removing unnecessary resin (resin in the photographs) covering the second area by using a removal tape. The photographs indicate a state of the comparative example after removal of the unnecessary resin. The photographs in FIG. 8 show residue of the unnecessary resin remaining on multiple parts of the second area. It is considered that such residue has remained on the second area because in the removal with the removal tape, the unnecessary resin was in a near-fluid state with the phase difference δ therein being greater than 48 degrees, and thus was torn.

FIG. 9 includes photographs illustrating an implementation example, which is formed by first disposing the uncured sheet-form sealing resin pertaining to the embodiment (wherein δ≤48°) with respect to first and second areas of a first substrate composed of a glass substrate, and then removing unnecessary resin covering the second area by using a removal tape, similar as in the forming of the comparative example. The photographs indicate a state of the implementation example after removal of the unnecessary resin. The photographs in FIG. 9 show only the second area of the glass substrate being exposed without residue of the unnecessary resin remaining on the second area. It is considered that residue of the unnecessary resin has not remained on the second area because in the removal with the removal tape, the unnecessary resin exhibited behavior of a solid material to an appropriate extent with the phase difference δ therein being no greater than 48 degrees, and thus was not torn.

Note that a typical panel includes two types of sealing resin. One is sealing resin that is disposed at an outer periphery of a display area in the form of a sheet, and the other is sealing resin that is disposed to fill the display area. In a typical ambient temperature during the process of manufacturing such a panel, the phase difference δ in the sheet-form sealing resin disposed at the outer periphery of the display area is within a range of at least 75 degrees and at most 85 degrees, and the phase difference δ in the sealing resin disposed to fill the display area is as great as approximately 90 degrees.

<Strain Response to Sinusoidal Wave Stress>

FIG. 10 is a graph indicating a sinusoidal wave of stress (referred to as a "sinusoidal stress wave" in the following) applied with respect to uncured sheet-form sealing resin and a sinusoidal wave of strain (referred to as a "sinusoidal strain wave" in the following) generated in response to the stress. More specifically, FIG. 10 illustrates a sinusoidal stress wave applied with respect to sheet-form sealing resin by using a rheometer, and overlaid on the sinusoidal stress wave, sinusoidal strain waves generated in response to the sinusoidal stress wave. In FIG. 10, sinusoidal strain waves are illustrated that lag behind the sinusoidal stress wave by a phase difference δ of 0 degrees, 48 degrees, and 90 degrees. Stress means force per unit area (expressed using the unit pascals (Pa)), and strain is a ratio of an amount of change to an original dimension of sheet-form sealing resin (expressed in percentage (%)).

When the phase difference δ is 0 degrees, the sinusoidal stress wave and the sinusoidal strain wave are in phase. Sheet-form sealing resin in which the phase difference δ is 0 degrees has the characteristics of a purely elastic material as described by Hooke's Law. That is, stress and strain response to the stress occur simultaneously.

Meanwhile, when the phase difference δ is 90 degrees, there is a π/2 radian (90 degree) phase difference between the sinusoidal stress wave and the sinusoidal strain wave. Uncured sheet-form sealing resin in which the phase difference δ is 90 degrees has the characteristics of a purely viscous material (a Newtonian fluid) as described by Newton's law of viscosity. That is, strain response to stress lags the stress by a 90 degree phase lag.

Further, when the phase difference δ is 48 degrees, there is a certain phase difference (48 degrees) between the sinusoidal stress wave and the sinusoidal strain wave. Uncured sheet-form sealing resin in which the phase difference δ is 48 degrees has intermediate characteristics, largely in between that of a purely viscous material and that of a purely elastic material. When the phase difference δ is 48 degrees, the uncured sheet-form sealing resin exhibits behavior of a solid material to a certain extent, and thus is not readily torn upon application of stress. The embodiment makes use of the elasticity that such uncured sheet-form sealing resin has, to prevent a situation where unnecessary resin is torn upon removal from a substrate and residue of the unnecessary resin remains on the substrate.

Note that the embodiment is expected to achieve the effect of preventing residue on a substrate when the phase difference δ in the unnecessary resin has any value no greater than 48 degrees (δ≤48°).

<Method of Evaluating Sheet-Form Sealing Resin Based on Loss Tangent and Complex Modulus of Elasticity>

FIG. 11 illustrates the relationship between the loss modulus, the storage modulus, and the complex modulus of elasticity.

Typically, the complex modulus of elasticity of a material is calculated by synthesizing the storage modulus and the loss modulus of the material. In addition, the complex modulus of elasticity is expressed as a ratio between stress σ and strain γ, as illustrated in FIG. 11.

A loss tangent (tan δ) is a ratio between the loss modulus and the storage modulus. When performing measurement of a loss tangent of uncured sheet-form resin, uncured sheet-form resin having a loss tangent of a relatively great value has characteristics closer to a fluid than a solid, whereas uncured sheet-form resin having a loss tangent of a relatively small value has characteristics closer to a solid than a fluid. Considering the range of the phase difference δ in the unnecessary resin defined in the embodiment (δ≤48°), it is preferable that the unnecessary resin have a loss tangent of no greater than 1.11.

<Performance Check Test>

(Temperature Dependency of Phase Difference δ)

In the test, sheet-form sealing resin 1 of uncured ultraviolet curable resin and sheet-form sealing resin 2 of uncured heat curable resin were used. The temperature dependency of the phase difference δ in such sheet-form sealing resin was examined by using a rheometer. The instrument settings of the rheometer were as follows.

Parallel plate radius: 20 mm
Gap: 100 μm
Strain: 1%

Angular displacement=(strain×gap)/plate radius=
(0.1×100 μm)/20 mm=5.0×10$^{-5}$ rad In the above, the strain (1%) is within a range where damage to the inner structure of a measurement target does not occur and within a range where a linear stress-strain relationship is observed in the measurement target.

[Test Conditions]

Instrument: AR series Rheometer manufactured by TA Instruments

Measurement method: A sinusoidal stress wave was applied to each measurement target (including the sheet-form sealing resin 1 or the sheet-form sealing resin 2) by applying oscillation by using the rheometer, and strain response to the stress so applied was measured. Further, the phase difference between a sinusoidal wave of the strain so measured and the sinusoidal stress wave applied was measured as the phase difference δ.

Temperature adjustment of sheet-form sealing resin: The temperature of the plate on which the measurement targets were placed was controlled so that the temperature of the sheet-form sealing resin therein changed within the temperature range of at least 20 degrees Celsius and at most 90 degrees Celsius.

Method of examining temperature dependency: The sheet-form sealing resin in each measurement target was removed from the glass substrate at multiple temperature points within the above temperature range of at least 20 degrees Celsius and at most 90 degrees Celsius. At each temperature point, in addition to the state of the sheet-form sealing resin in the measurement target, whether or not residue of the sheet-form sealing resin is present on the glass substrate was checked by using an optical microscope. When residue of the sheet-form sealing resin was present on the glass substrate, the measurement target was evaluated as being unsatisfactory. On the other hand, when residue of the sheet-form sealing resin was not present on the glass substrate, the measurement target was evaluated as being satisfactory.

[Test Results and Consideration]

Table 1 indicates the results of the above test performed with respect to measurement targets including the sheet-form sealing resin 1, whereas Table 2 indicates the results of the above test performed with respect to measurement targets including the sheet-form sealing resin 2.

Further, FIG. 12 is a graph indicating the temperature dependency of the phase difference δ in the sheet-form sealing resin 1 and the sheet-form sealing resin 2. The graph was prepared by using the measurement values in Tables 1 and 2.

Note that in FIG. 12, a phase difference of 90 degrees indicates a purely viscous material as described by Newton's law of viscosity. On the other hand, a phase difference of 0 degrees indicates a purely elastic material as described by Hooke's Law. Further, in FIG. 12, it is considered that the phase difference δ increases/decreases in sheet-form sealing resin when temperature increases, due to softening of the sheet-form sealing resin and an increase in adhesion between the sheet-form sealing resin and the substrate.

The phase difference δ increases when the softening of sheet-form sealing resin has greater influence than the increase in adhesion between the sheet-form sealing resin and the substrate. On the other hand, the phase difference δ decreases when the softening of sheet-form sealing resin has smaller influence than the increase in adhesion between the sheet-form sealing resin and the substrate.

TABLE 1

Results for sheet-form sealing resin 1 (heat curable resin)

| Temperature at removal (° C.) | Resin state | Phase difference δ (°) | Residue observed? | Residue state | Evaluation |
| --- | --- | --- | --- | --- | --- |
| 25 | Unhardened | 61 | Yes | Viscous | Unsatisfactory |
| 30 | Unhardened | 58 | Yes | Viscous | Unsatisfactory |
| 40 | Unhardened | 77 | Yes | Viscous | Unsatisfactory |
| 50 | Somewhat hardened | 72 | Yes | Somewhat elastic | Unsatisfactory |
| 60 | Somewhat hardened | 60 | Yes | Somewhat elastic | Unsatisfactory |
| 70 | Somewhat hardened | 51 | Yes | Somewhat elastic | Unsatisfactory |
| 80 | Hardened | 43 | Yes | Elastic | Unsatisfactory |
| 90 | Hardened | 41 | Yes | Elastic | Unsatisfactory |

TABLE 2

Results for sheet-form sealing resin 2 (ultraviolet curable resin)

| Temperature at removal (° C.) | Resin state | Phase difference δ (°) | Residue observed? | Residue state | Evaluation |
| --- | --- | --- | --- | --- | --- |
| 25 | Unhardened | 39 | No | — | Satisfactory |
| 30 | Unhardened | 48 | No | — | Satisfactory |
| 40 | Unhardened | 41 | No | — | Satisfactory |
| 50 | Unhardened | 35 | No | — | Satisfactory |
| 60 | Unhardened | 42 | No | — | Satisfactory |
| 70 | Unhardened | 51 | Yes | Viscous | Unsatisfactory |
| 80 | Unhardened | 58 | Yes | Viscous | Unsatisfactory |
| 90 | Unhardened | 62 | Yes | Viscous | Unsatisfactory |

According to the test results, residue of the sheet-form sealing resin 1 remained on the glass substrate at every temperature point within the above range of at least 20 degrees Celsius and at most 90 degrees Celsius, as shown in Table 1. Thus, the sheet-form sealing resin 1 was evaluated as being unsatisfactory at each temperature point.

In particular, at the temperature points 25 degrees Celsius, 30 degrees Celsius, and 40 degrees Celsius, which are relatively low temperatures within the above range, the sheet-form sealing resin 1 was in unhardened state, and thus the residue of the sheet-form sealing resin 1 was in a fluid state with high softness. It is considered that uncured sheet-form sealing resin with high softness, with the phase difference δ therein being relatively great, is likely to be torn when removed from the glass substrate and to produce residue.

Further, as the temperature of the sheet-form sealing resin 1 increased from 50 degrees Celsius to 60 degrees Celsius, and to 70 degrees Celsius, the residue of the sheet-form sealing resin 1 became somewhat closer to a solid. At the highest temperature points (80 degrees Celsius and 90 degrees Celsius), the residue of the sheet-form sealing resin 1 was in a solid state. This is since the sheet-form sealing resin 1 was made of heat curable resin, and thus, the hardening of the heat curable resin progressed as temperature increased. Note that when sheet-form sealing resin of high softness comes in contact with a glass substrate, the sealing resin penetrates into the minute concavities and convexities existing in the surface of the glass substrate. This results in an increase in adhesion between the sheet-form sealing resin and the glass substrate. Hardening of the sheet-form sealing resin in such a state results in a difficulty of removing unnecessary resin from the glass substrate. This is due to a phenomenon where the sheet-form sealing resin engages with the glass substrate, which may be referred to as an "anchor effect". The phase difference δ in the sheet-form sealing resin 1 becomes smaller than 48 degrees as temperature increases and the consequent hardening of resin occurs. It is considered that residue of the sheet-form sealing resin 1 remained on the surface of the glass substrate, particularly when the temperature of the sheet-form sealing resin 1 was high, because the removal of unnecessary resin from the glass substrate became difficult due to the anchor effect of the unnecessary resin and the likeliness of the sheet-form sealing resin 1 being torn.

As shown in Table 1 and FIG. 12, the phase difference δ in the sheet-form sealing resin 1 was within a range of 51 degrees to 77 degrees in the temperature range of 25 degrees Celsius to 70 degrees Celsius. Further, the phase difference δ in the sheet-form sealing resin 1 was within a range of 41 degrees to 43 degrees in the temperature range of 80 degrees Celsius to 90 degrees Celsius, and thus was no greater than 48 degrees within the temperature range of 80 degrees Celsius to 90 degrees Celsius. However, note that at such a high temperature, it may be difficult to cleanly remove the unnecessary sealing 141 from the glass substrate due to increased adhesion between the sheet-form sealing resin 1 and the glass substrate, and/or it may be difficult to ensure sufficient adhesion strength between the sheet-form sealing resin 1 and the EL substrate due to hardening of the sheet-form sealing resin 1 progressing too further.

Meanwhile, Table 2 and FIG. 12 indicate the results of the above test performed with respect to the sheet-form sealing resin 2. The test results confirm that, at relatively low temperature points of 25 degrees Celsius, 30 degrees Celsius, 40 degrees Celsius, 50 degrees Celsius, and 60 degrees Celsius, the sheet-form sealing resin 2 was in unhardened state (a gel state), the phase difference δ in the sheet-form sealing resin 2 was no greater than 48 degrees, and residue of the sheet-form sealing resin 2 was not present on the glass substrate. Thus, the sheet-form sealing resin 2 was evaluated as being satisfactory within the temperature range of 25 degrees Celsius to 60 degrees Celsius.

It is considered that the residue of the sheet-form sealing resin 2 was not present on the glass substrate since the sheet-form sealing resin 2 was suppressed from being torn into small pieces upon removal of unnecessary resin of the sheet-form sealing resin 2 from the glass substrate, or that is, the unnecessary resin was removed while the form of the unnecessary resin as a single body was maintained.

Meanwhile, as the temperature of the sheet-form sealing resin 2 increased from 70 degrees Celsius to 80 degrees Celsius, and to 90 degrees Celsius, the phase difference δ in the sheet-form sealing resin 2 increased from 51 degrees to 58 degrees, and to 62 degrees, which indicates an increase in softness of the sheet-form sealing resin 2. As a result, fluid-state residue of the sheet-form sealing resin 2 was found remaining on the glass substrate at such temperature points. Thus, the sheet-form sealing resin 2 was evaluated as being unsatisfactory within the temperature range of 70 degrees Celsius to 90 degrees Celsius.

From such test results, it is considered that unnecessary resin of the sheet-form sealing resin 2 can be removed from the substrate in an excellent manner while preventing residue of the sheet-form sealing resin 2 from remaining on the surface of the substrate, when the sheet-form sealing resin 2 is in unhardened state and the phase difference δ in the sheet-form sealing resin 2 is no greater than 48 degrees, upon removal from the substrate.

Note that at high temperatures, the sheet-form sealing resin 2 exhibits fluidity, which results in the sheet-form sealing resin 2 tightly covering the concavities and convexities on the surface of the substrate and the adhesion between the sheet-form sealing resin 2 and the substrate increasing excessively. As such, at high temperatures, cleanly removing unnecessary resin of the sheet-form sealing resin 2 from the substrate may be difficult. As such, in the separating step, it is preferable that the uncured sheet-form sealing resin 2 be maintained at as low a temperature as possible (for example, at most 60 degrees Celsius), illustration of which is provided in FIG. 12 by using broken lines and the indication of "Optimal range".

In addition, when referring to the graph in FIG. 12, the phase difference δ in the sheet-form sealing resin 2 decreases within the temperature range of 30 degrees Celsius to 50 degrees Celsius, which appears to indicate a tendency of the sheet-form sealing resin 2 transforming into a solid within such a temperature range. However, it should be noted that this decrease in the phase difference δ in the sheet-form sealing resin 2 in such a temperature range is a result of a value obtained through measurement with a rheometer taking into consideration not only the physical property of sheet-form sealing resin, but also the adhesion of the sheet-form sealing resin with the substrate. As such, it is assumed that fluidization of the sheet-form sealing resin 2 actually progresses in such a temperature range, accompanying the increase in temperature.

In addition, as can be seen from the consideration provided up to this point, the factor that determines whether or not residue of uncured sheet-form sealing resin remains on a substrate upon removal of unnecessary resin of the sheet-form sealing resin is the phase difference δ in the sheet-form sealing resin, and not how the sheet-form sealing resin is cured. More specifically, description has been provided above taking the sheet-form sealing resin 1 and the sheet-form sealing resin 2 as examples of heat curable resin and ultraviolet curable resin, respectively. However, it is considered that as long as the phase difference δ in uncured sheet-form sealing resin is no greater than 48 degrees upon separation from the substrate, the sheet-form sealing resin exhibits behavior more similar to a solid material and can be removed from the substrate without being torn, regardless of whether the sheet-form sealing resin is heat curable resin or ultraviolet curable resin.

<Other Matters>

In the embodiment, description is provided taking an organic EL display panel as one example of the joined body pertaining to the present disclosure. Alternatively, the joined body pertaining to the present disclosure may be another type of a joined body. For example, the joined body pertaining to the present disclosure may be an electrostatic touch panel or a liquid crystal panel.

In the embodiment, description is provided that the CF substrate 20 is the first substrate and the EL substrate 10 is the second substrate. Alternatively, the EL substrate 10 may be the first substrate and the CF substrate 20 may be the second substrate.

Further, a modification may be made such that the first substrate has a belt-like shape. When making such a modification, the first area may be disposed in plurality in the first substrate. Further, when making such a modification, particularly when the first substrate is the CF substrate 20, a plurality of first areas A3 may be formed with respect to the base substrate 11 having the belt-like shape along a lengthwise direction of the base substrate 11, and the black matrices 12 and the color filter layers 13R, 13G, 13B may be formed within each of the first areas A3. When making such a modification, a further modification may be made of providing the substrate 1, which is the second substrate, also with a belt-like shape, forming a plurality of light-emission areas A1 on the substrate 1, arranging each of the light-emission areas A1 and one of the first areas A3 to face each other with the uncured sheet-form sealing resin 140 in between, and forming an organic EL display panel that is the joined body pertaining to the present disclosure.

In the embodiment, description is provided based on examples where the first substrate and the second substrate have plate-like shapes. Alternatively, each of the first substrate and the second substrate may have a shape other than a plate-like shape. For example, each of the first substrate and the second substrate may have the shape of a rectangular solid or a sphere.

In the embodiment, description is provided on an example involving a sheet material including a pair of separable layers (films) and uncured sheet-form sealing resin sandwiched between the separable layers. Alternatively, a sheet material may be used that includes only one separable layer and uncured sheet-form sealing resin disposed on the single separable layer.

Note that the uncured sheet-form resin pertaining to the present disclosure is characterized in that the phase difference δ therein is no greater than 48 degrees, at least when separated from the first substrate in the separating step. That is, the phase difference δ in the uncured sheet-form resin pertaining to the present disclosure may be greater than 48 degrees during procedures other than the separation from the first substrate in the separating step.

In connection with this, the present inventors have confirmed through a confirmation test that even when using sheet-form sealing resin in which the phase difference δ is no smaller than 75 degrees, by causing the phase difference δ in such sheet-form sealing resin to decrease to no greater than 48 degrees at least immediately before the separating step, the softness of the sheet-form sealing resin can be reduced and unnecessary resin of the sheet-form sealing resin can be removed excellently from the first substrate. As such, the phase difference δ in the sheet-form sealing resin pertaining to the present disclosure may be greater than 48 degrees before the separating step.

The phase difference δ in sheet-form sealing resin can be reduced in several ways. For example, one way is by reducing the temperature of sheet-form sealing resin by the time the separating step is performed with respect to the sheet-form sealing resin, and another way is causing an unnecessary resin part of the sheet-form sealing resin to undergo polymerization to a small extent (to a polymerization degree of several percents) before removal of the unnecessary resin part.

In the embodiment, description is provided on an example where the second area A4 is adjacent to the first area A3 and surrounds the first area A3. However, the arrangement of the second area A4 with respect to the first area A3 may differ from this, as long as the second area A4 is arranged on the same substrate as the first area A3 but at a position differing from that of the first area A3.

INDUSTRIAL APPLICABILITY

The method of manufacturing a joined body pertaining to the present disclosure is widely applicable in, for example, the manufacture of organic EL display panels.

REFERENCE SIGNS LIST

1 TFT substrate
2 anode
3 hole injection layer
4 barrier wall (bank)
5 organic light-emission layer
6 electron transport layer
7 cathode
10 EL substrate
11 base substrate
12 black matrix (BM)
13R, 13G, 13B color filter layer
14 resin sealing layer
20 CF substrate
20X first substrate
30 sheet-form sealing resin-provided CF substrate
40 sheet material
100 organic EL display panel
140, 140X uncured sheet-form sealing resin
140A film layer (first separable layer)
140B film layer (second separable layer)
141, 141X unnecessary resin
141A first separable layer outer part
142 laser beam trace
143, 143X non-removal resin
143A first separable layer inner part
145 removal tape
146, 147 tape adhesion part
200 processing head

The invention claimed is:

1. A method of manufacturing a joined body, comprising:
covering a first area and a second area of a first substrate with a sheet of resin containing ultraviolet curable resin in an uncured state;
separating a part of the sheet covering the second area from the first substrate, the separating performed after the covering; and
joining the first substrate with a second substrate by arranging the second substrate to face the first substrate with a part of the sheet covering the first area between the first substrate and the second substrate, and curing the resin in the part of the sheet covering the first area, the joining performed after the separating, wherein
during the separating, a phase difference δ between stress and strain in the part of the sheet covering the second area is between 35 degrees and 48 degrees, inclusive, and a temperature of the part of the sheet covering the second area is between 25 degrees Celsius and 60 degrees Celsius, inclusive,
the separating is performed by peeling the part of the sheet covering the second area from the first substrate by exerting mechanical stress on the sheet, and
in the separating, at least the part of the sheet covering the second area is in the uncured state.

2. The method of claim 1, wherein
before the separating, the phase difference δ between stress and strain in the part of the sheet covering the second area is greater than 48 degrees.

3. The method of claim 1, wherein
the sheet of resin contains at least one of acrylic resin, epoxy resin, silicone resin, and olefin resin.

4. The method of claim 1 further comprising:
cutting the sheet at a boundary between the first area and the second area, the cutting performed after the covering and before the separating, wherein
the first area and the second area are adjacent areas.

5. The method of claim 4, wherein
the separating is performed by adhering a removal tape to the part of the sheet covering the second area and removing, away from the first substrate, the part of the sheet covering the second area along with the removal tape.

6. The method of claim 5, wherein
the covering is performed by disposing, with respect to the first substrate, a laminate including the sheet and a separable layer, and thereby covering the first area and the second area with the sheet,
the cutting is performed by radiating a laser beam from outside the separable layer and cutting both the sheet and the separable layer at the boundary between the first area and the second area with the laser beam, and
the separating is performed by removing a part of the separable layer covering the second area, adhering the removal tape to extend over the part of the sheet covering the second area and a part of the separable layer covering the first area, and removing, away from the first substrate, the part of the sheet covering the second area and the part of the separable layer covering the first area along with the removal tape.

7. The method of claim 1, wherein
an area of the second substrate facing the first area has a plurality of light-emission elements disposed therein.

8. The method of claim 7, wherein
the first area has a plurality of color filter layers disposed therein.

9. The method of claim 7, wherein
the second area surrounds the first area.

* * * * *